United States Patent [19]
Imanishi et al.

[11] Patent Number: 6,005,182
[45] Date of Patent: Dec. 21, 1999

[54] THERMOELECTRIC CONVERSION MODULE AND METHOD OF MANUFACTURING THE SAME

[75] Inventors: Yuichiro Imanishi; Makoto Miyoshi; Tetsuo Watanabe, all of Nagoya; Keiko Kushibiki, Fujisawa; Kazuhiko Shinohara, Yokohama; Masakazu Kobayashi, Yokosuka; Kenji Furuya, Yokohama, all of Japan

[73] Assignee: NGK Insulators, Ltd., Japan

[21] Appl. No.: 09/080,729

[22] Filed: May 21, 1998

[30] Foreign Application Priority Data

May 22, 1997 [JP] Japan .................................. 9-132331

[51] Int. Cl.$^6$ .................................................. H01L 35/34
[52] U.S. Cl. ........................ 136/201; 136/200; 136/203; 136/205
[58] Field of Search .................................. 136/200, 201, 136/203, 205

[56] References Cited

U.S. PATENT DOCUMENTS

| | | | |
|---|---|---|---|
| 5,705,434 | 1/1998 | Imanishi et al. ...................... | 136/201 |
| 5,864,087 | 1/1999 | Amano et al. ......................... | 136/205 |

FOREIGN PATENT DOCUMENTS

| | | | |
|---|---|---|---|
| 718574 | 9/1965 | Canada ................................. | 136/201 |
| 61-263176 | 11/1986 | Japan . | |
| 63-110779 | 5/1988 | Japan .................................. | 136/200 |
| 2-30190 | 1/1990 | Japan .................................. | 136/200 |
| 5-283573 | 10/1993 | Japan . | |
| 7-162039 | 6/1995 | Japan . | |
| 8-18109 | 1/1996 | Japan . | |
| 1130334 | 10/1968 | United Kingdom .................. | 136/201 |
| 1133611 | 11/1968 | United Kingdom .................. | 136/201 |

*Primary Examiner*—Kathryn Gorgos
*Assistant Examiner*—Thomas H. Parsons
*Attorney, Agent, or Firm*—Parkhurst & Wendell, L.L.P

[57] ABSTRACT

A thermoelectric conversion module including a honeycomb structural body 3 made of an electrically insulating material, N type and P type semiconductor elements 1 and 2 inserted into through holes formed in the honeycomb structural body 3, electrically insulating filler members 4 filled in spaces between the semiconductor elements and inner walls of the through holes such that the semiconductor elements are fixed in position within respective through holes, and electrodes 7 connecting end surfaces of the semiconductor elements on polished end surfaces of the honeycomb structural body such that N type and P type semiconductor elements are alternately connected in series. According to the invention, the electrically insulating filler members are made of an inorganic adhesive of alkali metal silicate or sol-gel glass. Since undesired heat dissipation and heat transfer through adjacent semiconductor elements can be prevented and undesired oxidation and dissipation of the semiconductor elements during a usage can be effectively removed, a high output power can be attained stably for a long life time when the thermoelectric conversion module according to the invention is used in an electric power generating system using an exhausted heat. The higher and lower temperature side surfaces of the module can be shaped into any desired configuration.

19 Claims, 3 Drawing Sheets

PRIOR ART

FIG_2

THERMOELECTRIC CONVERSION MODULE AND METHOD OF MANUFACTURING THE SAME

BACKGROUND OF THE INVENTION

1. Field of the Invention

The present invention relates to a thermoelectric conversion module for use in an apparatus utilizing a thermoelectric effect such as electronic cooling apparatus and electric power generating apparatus, and more particularly to a thermoelectric conversion module having N type semiconductor elements and P type semiconductor elements, which are connected in series with each other by means of metal electrodes and are thermally and electrically isolated from adjacent semiconductor elements by a module core consisting of an electrically insulating material. The present invention also relates to a method of manufacturing such a thermoelectric conversion module.

2. Related Art Statement

When a pair of thermoelectric conversion elements comprising P type semiconductor element and N type semiconductor element, respectively are electrically connected in series and a connected end portion is subjected to a higher temperature and the other end portion is subjected to a lower temperature, there is generated a thermoelectric voltage across these end portions in accordance with a temperature difference. This phenomenon is called the Seebeck effect. In the above thermoelectric conversion element pair, when a current flows from one semiconductor element to the other semiconductor element, one end portion absorbs heat and the other end portion generates heat. This phenomenon is called the Peltier effect. Furthermore, when one of the p type semiconductor element and N type semiconductor element is subjected to a higher temperature and the other is subjected to a lower temperature and an electric current flows along a temperature gradient, heat is absorbed or generated in accordance with direction of the current. This phenomenon is called the Thomson effect.

The thermoelectric conversion module utilizing the above mentioned effects does not includes a movable member which might produce undesired vibration, noise and abrasion, and thus may be advantageously used as a direct energy conversion apparatus having simple construction and long life time and being easily managed. Such a thermoelectric conversion module comprises at least one pair of P type semiconductor element and N type semiconductor element, and usually the element pairs are connected electrically in series and thermally in parallel. The thermoelectric conversion module has been used as an electric power generating apparatus using the above mentioned Seebeck effect, in which a voltage is generated in accordance with a temperature difference, and as a thermoelectric cooling apparatus using the Peltier effect, in which one end portion is cooled by producing a temperature difference in accordance with a voltage applied across both end portions.

FIG. 1 is a schematic view showing a known thermoelectric conversion module. P type semiconductor elements 21 and N type semiconductor elements 22 are arranged in accordance with a given pattern. One end portion of adjacent thermoelectric elements is connected by means of electrodes 26 formed on an insulating substrate 25 and the other end portion of adjacent thermoelectric elements is connected by means of electrodes 27 also formed on an insulating substrate such that successive thermoelectric elements are connected in series. No heat insulating members are provided between adjacent thermoelectric elements and the thermoelectric module has a skeleton structure. It should be noted that in FIG. 1 the insulating substrate for the electrodes 27 is not shown for the sake of simplicity.

In general, the thermoelectric module includes several tens of semiconductor element pairs. As explained above, since the known thermoelectric module has the skeleton structure, it is rather difficult to arrange accurately a number of semiconductor elements in accordance with a given pattern and to connect these semiconductor elements in series and are kept in position until the electrodes are secured to the elements. Further, the known thermoelectric conversion module has a drawback that it could not have a large mechanical strength.

In order to mitigate the above drawbacks of the known thermoelectric conversion module shown in FIG. 1, several proposals have been done for the construction and manufacturing method of the thermoelectric conversion module.

(1) In Japanese Patent Laid-open Publication Kokai Hei (JP-A) 5-283753, there is proposed a structure in which p type and N type semiconductor elements are arranged within holes formed in a heat resisting insulator, and in JP-A 7-162039, there is shown a structure in which semiconductor elements are inserted into holes formed in a mold substrate made of an electrically insulating material.

In such structures, the P type and N type semiconductor elements can be inserted into the through holes formed in the insulating body without using any tool, and therefore a workability is improved, adjacent elements can be effectively isolated from each other, and a mechanical strength of the thermoelectric module can be increased.

(2) There has been also proposed another known structure, in which spaces between adjacent semiconductor elements are filled with an electrically insulating material. For instance, in JP-A 8-18109 and U.S. Pat. No. 4,459,428, there is disclosed a structure in which P type and N type semiconductor elements pairs are embedded in an insulating material. In JP-A 61-263176, there is proposed a structure in which a plurality of P type and N type semiconductor layers are stacked, spaces are formed in portions other than PN junctions, and the spaces are filled with an electrically insulating glass material. In thermoelectric conversion modules having such structures, since spaces between adjacent semiconductor elements are filled, with an insulating material, the mechanical strength of the module is improved and the semiconductor elements can have acid proof and anticorrosion property.

However, in the known thermoelectric conversion module described in the above mentioned item (1), it is difficult to manufacture a thermoelectric conversion module in which a height defined as a distance between a higher temperature end surface and a lower temperature end surface is uniform over a whole surface of the module. In a thermoelectric conversion system in which a number of thermoelectric conversion modules are integrally arranged, it is important to make uniform thermal contact between a heat source and the modules. Therefore, a high accuracy in the height of the thermoelectric conversion modules is important. Particularly, in an electric power generating system formed by thermoelectric conversion modules in order to generate electric power by utilizing an exhausted heat from a combustion system of an automobile, it is necessary to arrange more than several tens thermoelectric conversion modules. In such a system, if the thermoelectric conversion modules have different heights, the temperature difference between end portions of the respective thermoelectric conversion modules is also varied in accordance with a thermal contact condition and output powers generated by respective thermoelectric conversion modules are varied, Then, thermoelectric conversion modules whose output power is low might consume output power of thermoelectric conversion modules generating higher output power. This results in a large decrease in the output power of the total thermoelectric conversion system.

Furthermore, in the known thermoelectric conversion modules described in the above item (1), there are formed air spaces between the semiconductor elements and inner walls of the holes into which elements are inserted, heat might dissipate from side walls of the semiconductor elements into the air spaces and heat transfer might occur within the air spaces. Therefore, a heat current passing through the elements is reduced, and as a result of which the output power is decreased. When the thermoelectric conversion module is applied to the electric power generating system utilizing heat exhausted from an internal combustion engine of an automobile, a higher temperature side is subjected to a very high temperature up to 800° C. and there is produced a large temperature difference between the higher temperature side and the lower temperature side. Therefore, it is particularly important to suppress an undesired reduction in the thermal energy passing through the semiconductor elements as far as possible. In the known construction proposed in the above item (1), in order to reduce an air space between a semiconductor element and an inner wall of the hole, these parts have to be manufactured with an extremely high precision, and therefore an operation of inserting the semiconductor element into the hole requires a high precision and becomes very cumbersome. In this manner, a manufacturing cost would be increased materially.

In the known thermoelectric conversion module proposed in the above item (2), semiconductor elements have to be maintained in position until spaces between adjacent elements are filled with an insulating material. In the thermoelectric conversion module disclosed in JP-A 61-263176, spaces between the semiconductor layers are filled with a glass material having a low melting point such as vitreous enamel. When the higher temperature side of the thermoelectric conversion module is heated to a temperature near the melting point or softening point of the low melting point glass, the glass filled in the spaces between the semiconductor layers is deformed due to a thermal expansion. When the temperature is increased up to the softening point, the glass is softened and deformed to a large extent Particularly, in the electric power generating system producing a large electric current, a current leakage due to the deformation and alternation of the insulating member might cause undesired overheat and a possibility of fire is increased.

In the above mentioned JP-A 8-18109, P type and N type semiconductor films are formed on glass substrates, respectively, and the semiconductor films are selectively removed by a dicing machine to form pillar-like semiconductor elements. Then, the glass substrates are stacked with each other such that the P type semiconductor elements and N type semiconductor elements are arranged alternately. Finally, spaces formed between the glass substrates are filled with an electrically insulating material. In such a method, an amount of semiconductor materials removed from the original semiconductor films becomes larger than that of the pillar-like semiconductor elements, and thus a manufacturing cost is increased.

In the above mentioned U.S. Pat. No. 4,459,428, after fixing the semiconductor elements by soldering electrodes to both ends of the semiconductor elements, spaces are filled with an insulating material. In this method, at first, electrodes are connected to one ends of the semiconductor elements held by a supporting member, then after removing the supporting member, electrodes are connected to the other ends of the semiconductor elements, and finally spaces are filled with the insulating material. In this case, since the electrodes have to be connected to the both ends of the semiconductor elements by different steps, it is necessary to prepare solders having different melting points. In general, a temperature at which electrodes are connected by soldering has to be set to a value within a range from a temperature of a higher temperature side of the thermoelectric conversion module under practical use and a sintering temperature of the semiconductor elements. When the higher temperature side of the thermoelectric conversion module is subjected to a high temperature, said temperature range becomes very narrow and it is practically difficult to prepare two kinds of solders or brazing materials having different melting points.

SUMMARY OF THE INVENTION

The present invention has for its object to provide a novel and useful thermoelectric conversion module which can mitigate the above mentioned drawbacks of the known modules, can be effectively used in an electric power generating system utilizing exhausted heat in an automobile and others, and can be manufactured on a large scale at a low cost.

It is another object of the invention to provide a thermoelectric conversion module, in which a loss in a generated electric power due to a heat transfer within air spaces between semiconductor elements can be reduced, a high power generating efficiency can be attained by suppressing a decrease in the output electric power due to oxidation and dissipation of the semiconductor material, a height, i.e. a distance between higher and lower temperature ends can be precisely determined, and both the higher temperature side and lower temperature side can be formed in any desired shape.

It is another object of the invention to provide a method of manufacturing the thermoelectric conversion module in an easy, precise and less expensive manner.

According to the invention, a thermoelectric conversion module comprises:

a honeycomb structural body made of an electrically insulating material, having mutually opposing first and second end surfaces, and having formed therein a plurality of through holes extending from the first end surface to the second end surface, alternating one or more through holes being classified into a first group and the remaining through horses being classified into a second group;

N type semiconductor elements, each being inserted into respective one of the through holes of the first group;

P type semiconductor elements, each being inserted into respective one of the through holes of the second group;

electrodes connecting adjacent N type and P type semiconductor elements or element groups in series on said first and second end surfaces of the honeycomb structural body; and electrically insulating filler members provided in spaces between the semiconductor elements and inner walls of the through holes formed in said honeycomb structural body and made of an inorganic adhesive of alkali metal silicate or sol-gel glass.

According the invention, a method of manufacturing a thermoelectric conversion module comprises the steps of:

preparing a honeycomb structural body made of an electrically insulating material, having mutually opposing first and second end surfaces and having formed therein holes extending from the first end surface to the second end surfaces, alternating one or more through holes being classified into a first group and the remaining through holes being classified into a second group;

inserting N type semiconductor elements into the through holes belonging to the first group and P type semiconductor elements into the through holes belonging to the second group;

filling spaces formed between semiconductor elements and inner walls of the through holes with an electrically insulating filling material made of an inorganic adhesive of alkali metal silicate or a sol-gel glass;

drying and solidifying the electrically insulating filling material filled in the spaces to form electrically insulating filler members to obtain a module core;

polishing at least one end surface of the module core; and connecting alternating N type semiconductor elements or element groups and P type semiconductor elements or element groups in series by means of electrodes on said first and second end surfaces of the honeycomb structural body.

The thermoelectric conversion module according to the invention has a unique structure of the module core consisting of the honeycomb structural body, semiconductor elements and filler members. In this case, the filler member according to the invention has multiple functions, i.e. a function for fixing the semiconductor elements in position within the respective through holes formed in the honeycomb structural body, a function for preventing the thermoelectric conversion module from being cracked and destroyed due to a difference in a thermal expansion between the honeycomb structural body and the semiconductor elements, a function for thermally isolating the inner walls of the honeycomb structural body and the semiconductor elements, and a function for preventing the semiconductor elements from being dissipated and oxidized. The inventors have experimentally confirmed that these functions can be optimally realized by using the filler members made of the inorganic adhesive of alkali metal silicate or sol-gel glass.

In the thermoelectric conversion module according to the invention, since the semiconductor elements are fixed in the through holes formed in the honeycomb structural body, all semiconductor elements can be arranged in position without fail. Moreover, end surfaces of the module core can be cut or polished into any desired shape without difficulty. Therefore, it is easy to manufacture precisely the thermoelectric conversion module having any desired surface configuration having a precisely determined height defined as a distance between the higher and lower temperature sides. Furthermore, it is easy to manufacture a thermoelectric conversion module which does not include insulating substrates on which electrodes are formed. In other words, the electrodes can be provided directly on the semiconductor elements.

In the thermoelectric conversion module according to the invention, the electrically insulating filler members effectively serve to absorb a difference in a thermal expansion between the honeycomb structural body and the semiconductor elements, and therefore a freedom of selecting a material for the honeycomb structural body becomes large and a suitable material having high mechanical strength and workability can be easily found.

In general, a low melting point glass is used as an inorganic adhesive. Such a low melting point glass has an advantage in that its thermal expansion can be easily controlled by adjusting the composition of the adhesive and the semiconductor element can be firmly secured to the honeycomb structural body. However, when the low melting point glass is used as the electrically insulating filler members according to the invention and the honeycomb structural body having the semiconductor elements inserted into the through holes is immersed into a molten glass heated to a high temperature, some semiconductor elements might be dropped out of through holes and some semiconductor elements might be deviated from a given position within through holes. Furthermore, it has been experimentally confirmed that that the honeycomb structural body and semiconductor elements were often secured to a jig supporting the honeycomb structural body and semiconductor elements.

The inventors have conducted various experiments in which various kinds of cementing agents were used as the inorganic adhesive. In this case, a possibility that electrode members are not firmly secured to the semiconductor elements was increased. The inventors have conducted many other experiments using various heat resisting inorganic adhesives as the electrically insulating filler members, and have found that the above s mentioned inorganic adhesive of alkali metal silicate and sol-gel glass are extremely suitable as the insulating filler members filled within spaces between the semiconductor elements and the inner walls of the through holes formed in the honeycomb structural body, because a process of inserting and fixing the semiconductor elements in the through holes can be carried out at a relatively low temperature without using special jig and tool. In this manner, the thermoelectric conversion module can be manufactured at a low cost with a high yield.

The inorganic adhesive of alkali metal silicate according to the invention is obtained by combining a hardening agent and a bone agent with a binder consisting of alkali metal silicate. For instance, commercially available alkali metal silicates are ARON CERAMICS E and ARON CERAMICS CC (trade name) manufactured by TOA GOSEI company. In order to adjust the thermal expansion coefficient and thermal shrinkage of the adhesive, an aggregate agent such as silica, zirconia, alumina and silicon carbide may be added to the commercially available inorganic adhesive of alkali metal silicate. When the filler member made of such a material is filled within a space between a semiconductor element and an inner wall of a through hole formed in the honeycomb structural body and is dried and solidified at about 200° C., the filler member is changed into a porous ceramics. Then, the thus obtained porous ceramics may be sintered.

The sol-gel glass used in the present invention is a glass or ceramics which can be produced by the sol-gel method. That is to say, the sol-gel glass is an amorphous oxide which may be obtained by hydrolysis or polycondensation reaction of a metal alkoxide. Metal alkoxide may be $Si(OM)_4$, $Ti(OM)_4$, $Zr(OM)_4$ and $Al(OM)_4$ (M=$CH_3$, $C_2H_5$, $C_3H_7$, $C_4H_9$ and so on). In order to adjust a thermal expansion coefficient and a temperature at which a gelatination reaction initiates, it is possible to use more than one metal alkoxides. Further powers or filaments of an aggregate agent such as silica, zirconia, alumina and silicon carbide may be added. According to the invention, a metal alkoxide material is subjected to the hydrolysis and polycondensation reaction to obtain a gel or wet gel, which is then filled in spaces between the semiconductor elements and inner walls of the through holes of the honeycomb structural body. Then, an assembly is heated and the wet gel is changed into a dry gel. As a case may be, the dry gel is heated and is changed into a porous glass or ceramics.

In this manner, according to the invention, the inorganic adhesive of alkali metal silicate or sol-gel glass is used as the electrically insulating filler members, and therefore the filling operation can be performed at a low temperature near the room temperature without using a special jig having a complicated construction. Therefore, the manufacturing cost can be decreased.

In a preferable embodiment of the thermoelectric conversion module according to the invention, the semiconductor elements are made of a material mainly consisting of a silicon-germanium material. Then, the semiconductor elements can be adhered to the honeycomb structural body firmly, and thus although hardness of the honeycomb structural body differs from that of the semiconductor elements, the module core can be cut and polished easily and precisely. Furthermore, because the filler members according to the invention may be porous glass or ceramics, a high heat insulating property can be obtained and a thermal expansion coefficient can be adjusted easily. Therefore, the semiconductor elements can be effectively prevented from being broken due to thermal impact.

According to the invention, it is desired to make the honeycomb structural body of the thermoelectric conversion module of a material which has an excellent electrically insulating property and a high mechanical strength at a high temperature, and which can be manufactured easily. Such a material for the honeycomb structural body may be selected from the group consisting of cordierite, alumina, silicon carbide and silicon nitride.

According to the invention, a semiconductor element may have any desired lateral cross sectional configuration such as circular, rectangular and hexagonal by taking into account the design of the module, a cross sectional configuration of a hole, a manufacturing method of the semiconductor elements and a composition of the semiconductor element.

In a preferable embodiment of the thermoelectric conversion module according to the invention, the semiconductor elements are made of a silicon-germanium. An optimum composition ratio of silicon to germanium may be determined in accordance with construction and design of the whole thermoelectric conversion module, voltage and current of generated electric power, configuration and temperature of a heat source, cooling method and cooling efficiency. In the thermoelectric conversion module for use in the electric power generating system in which an electric power is generated by utilizing an exhausted heat, x in $Si_xGe$ may be preferably set to a value with a range from 0.6 to 5.7 (x=0.6–5.7). When x is set to a value smaller than 0.6, melting point of the semiconductor element becomes too low and a maximum usable temperature of the thermoelectric power generating module is lowered and the semiconductor element could not be manufactured easily, because a temperature at which a thermal treatment such as electrode connecting or forming is carried out is limited. Further, when x is set to a value larger than 5.7, a melting point of the semiconductor element becomes too high and a sintering temperature becomes higher, and therefore a manufacturing cost is increased.

In a preferable embodiment of the thermoelectric conversion module according to the invention, the semiconductor element may be formed by a thick film or sintered body made of a material mainly consisting of a silicon-germanium and including a small amount of B, Al, Ga, In, N, P, As, Sb and Zn in order to control electric conductivity, thermal conductivity, Seebeck constant and sintered density. In dependence upon a condition of sintering and film deposition, a small amount of C, O and H may be added to the semiconductor material.

The semiconductor element made of the above mentioned silicon-germanium may be sintered by known hot press sintering or plasma sintering, and then a sintered body may be cut into semiconductor elements having desired shape and size.

In the method of manufacturing the thermoelectric conversion module according to the invention, after forming the module core and polishing its end faces, electrode segments are secured to the polished end faces of the semiconductor elements. The electrode segments may be provided by soldering or braze welding or diffusion and pressing. Furthermore, thick electrode films may be deposited by plasma thermal spraying. In this case, since on the end surfaces of the module core, spaces between the semiconductor elements and inner walls of through holes formed in the honeycomb structural body are filled with the filler members, electrodes may be formed by thick metal films which can be easily formed into a desired pattern by the plasma thermal spraying. In the soldering, braze welding and diffusion-pressing, since the end surfaces of the module core can be formed to have a precisely determined flatness and can be precisely in parallel with each other, any accidental error that electrodes are removed from the semiconductor elements or are deviated from desired positions and some electrode segments could not be secured to the semiconductor elements can be effectively mitigated. Moreover, the module core has a precisely determined height, the formation of the electrodes can be performed for a plurality of module cores simultaneously. Further, the electrode segments may be made of Cu. Mo, NI—Cr, W, Ta, alloys of these metals, and stainless steel alloy.

As stated above, according to the invention, it is preferable to use the semiconductor elements made of a silicon-germanium semiconductor material. But according to the inventions the semiconductor elements may be made of metal silicide and Pb—Te. These semiconductor material can resist high temperature.

DESCRIPTION OF THE PREFERRED EMBODIMENTS

Embodiment 1

Figure 1:
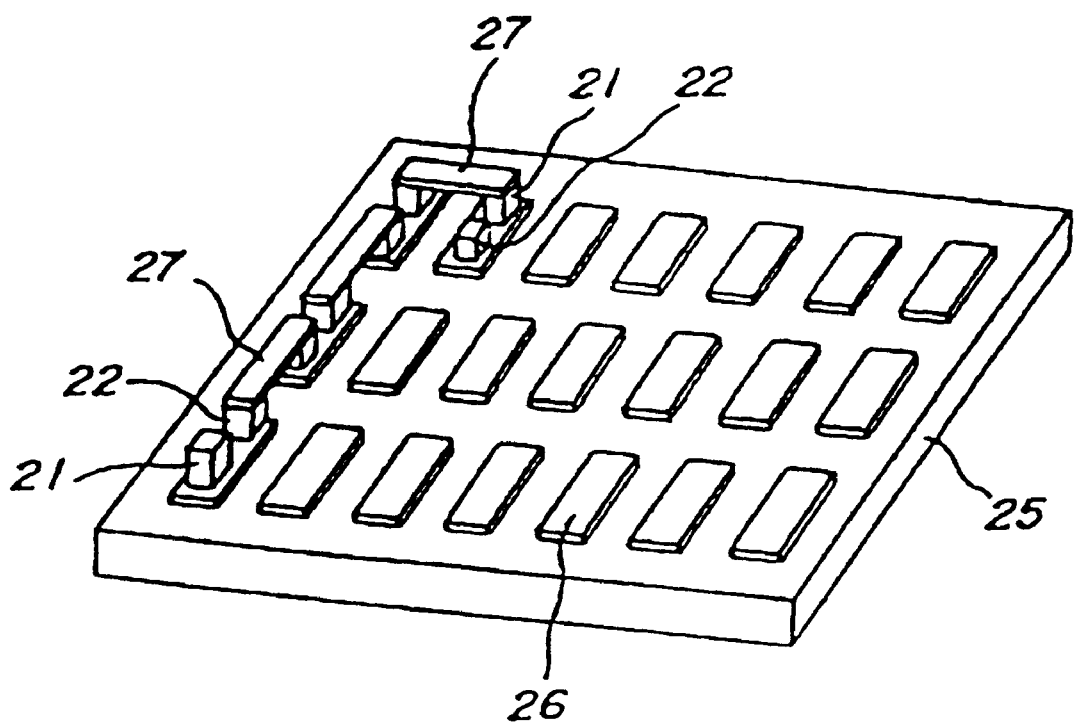
FIG. 1 is a schematic perspective view showing a known thermoelectric conversion module.
Figure 2:
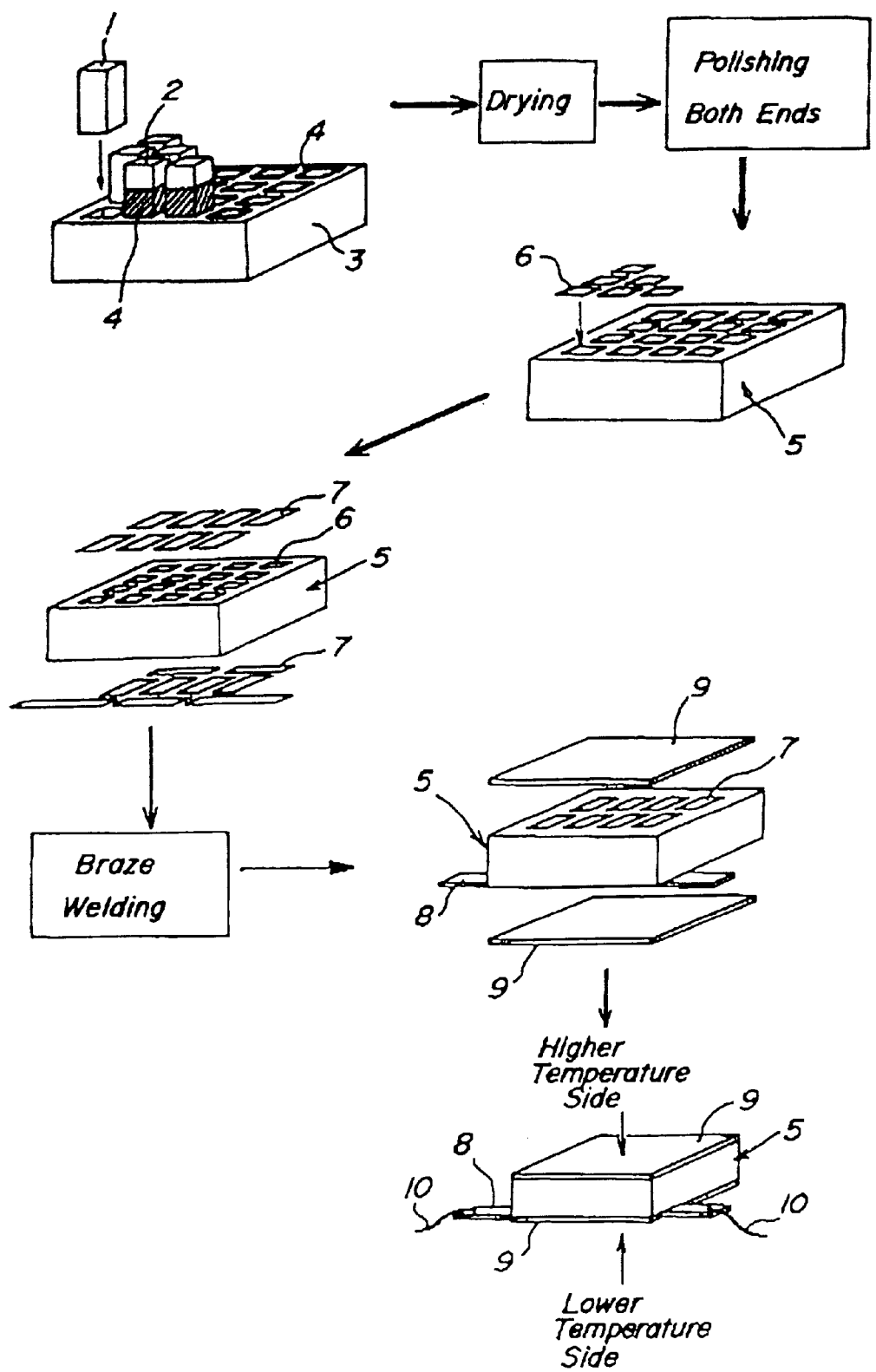
FIG. 2 is a schematic view illustrating successive steps of manufacturing an embodiment of the thermoelectric conversion module according to the invention.

FIG. 2 is a schematic view showing successive steps of the method of manufacturing an embodiment of the thermoelectric conversion module according to the invention.

At first, P type semiconductor elements 1 and N type semi-conductor elements 2 were prepared. These semiconductor cements were formed by sintering $Si_2Ge$ powders doped with B and P, respectively by hot press sintering and by cutting sintered bodies into elements having a size of 3.5×3.5×10 mm. An inorganic adhesive of an alkali metal silicate, e.g. ARON CERAMICS E (trade name) manufactured by TOA GOSEI Company was applied on outer surfaces of the semiconductor elements 1 and 2, and the semiconductor elements were inserted into through holes formed in a honeycomb structural body 3 such that spaces between the semiconductor elements and inner walls of the through holes were filled with an electrically insulating filter members 4 made of said inorganic adhesive of alkali metal silicate. After drying an assembly at 190° C. within a drying room, both end surfaces of the assembly were polished to obtain a module core 5 having a height of 9.00 mm.

On end surfaces of the semiconductor elements 1, 2 exposing on the polished end surfaces of the module core 5, braze films 6 made of Ti and having a thickness of 0.06 mm were applied. And then, electrode segments 7 made of Mo and having a thickness of 0.2 mm are applied or the module core 5 in accordance with a given pattern. While load was applied to the electrode segments 7, the assembly was heated at a temperature of 930° C. for five minutes under a pressure of $10^{-5}$ Torr and the electrode segments were braze welded to the semiconductor elements 1, 2. In this manner, a thermoelectric conversion module having a height of 9.51 was obtained. After cementing AlN insulating substrates 9 onto the electrode segments by means of the ARON CERAMICS E and drying an assembly, Pt wires 10 were soldered by ultrasonic welding to lead electrodes 8 which were soldered on the lower temperature side of the module such that the lead electrodes were projected outwardly.

The thermoelectric conversion module was secured onto a water cooled block by means of a grease and an output electric power generated by the module was measured while a block heater was urged against the upper end of the block. 0.5 W was observed under the heater temperature of 600° C. and the cooling water temperature of 50° C. After keeping this condition for 48 hours, a reduction of the output electric power was not recognized. Thirty thermoelectric conversion modules were manufactured and their heights were 5.91 mm±0.02 mm. It should be noted that if the water cooled block and block heater have electrically insulating surfaces and the thermoelectric conversion module is applied to these members by means of an electrically insulating adhesive, the insulating substrates 9 shown in FIG. 2 may be dispensed with.

As explained above, in the thermoelectric conversion module according to the invention, the semiconductor elements 1 and 2 are fixed by the filler members 4 already in the module core 5, both end surfaces of the module core 5 can be polished easily. Therefore, it is possible to manufacture the thermoelectric conversion module having a precisely determined height on a large scale without requiring any special jig or tool. Further, an operation temperature may be high, a loss in the generating output power due to a heat dissipation from the semiconductor elements and heat transfer can be mitigated, and thus it is possible to attain a high output power. Moreover, the semiconductor elements can be effectively prevented from being oxidized or dissipated, and therefore the high output power can be maintained for a very long life time.

Embodiment 2

Figure 3:
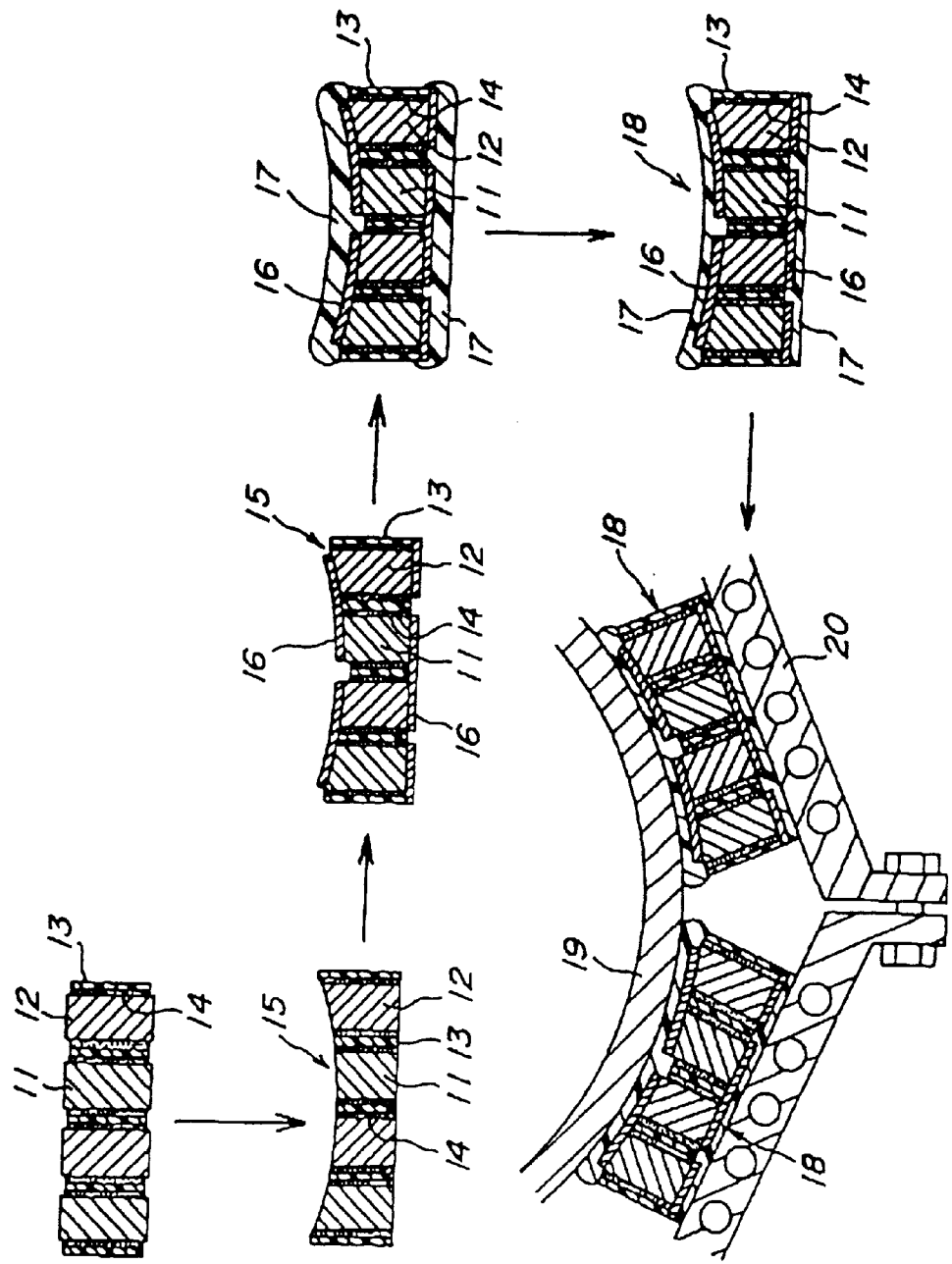
FIG. 3 is a schematic view depicting successive steps of manufacturing another embodiment of the thermoelectric conversion module according to the invention.

FIG. 3 is a schematic view illustrating successive steps for manufacturing another embodiment of the thermoelectric conversion module according to the invention. P type semiconductor elements 11 and N type semiconductor elements 12 were inserted into through holes formed in a honeycomb structural body 13 and spaces between the semiconductor elements and inner walls of the through holes were filled with filler members 14 made of an inorganic adhesive of an alkali metal silicate having SiC powder added thereto as an aggregate agent. After curing the filler members 14, a higher temperature side surface was polished into a curved shape and a lower temperature side surface was polished into a flat shape to obtain a module core 15. On both surfaces of the module core 15, electrode films 16 were formed by spraying Mo in accordance with a given pattern by means of the plasma thermal spraying method. The Mo electrode films 16 had a thickness of 100 $\mu$m. On the electrode films 16 alumina was sprayed by the high speed flame spraying method to form electrically insulating films 17 having an average thickness of 200 $\mu$m. Surfaces of the electrically insulating films 17 were polished to adjust curvature and surface roughness to obtain the thermoelectric conversion module 18. The higher temperature sides of a plurality of thermoelectric conversion modules 18 were brought into intimate contact with an outer surface of an exhaust pipe and the lower temperature sides were brought into intimate contact with a water cooled jacket having a polygonal shape. Output electric power of 0.3 W could be obtained per respective modules.

As stated above, in the thermoelectric conversion module according to the invention, no space is formed between the semiconductor elements and inner walls of the through holes formed in the honeycomb structural body and the filler members could not be softened or subjected to undesired reaction even if the semiconductor elements are heated to a high temperature locally due to sprayed particles melting at a high temperature. Therefore, the electrode films and insulating films can be formed to have a large thickness by means of the spraying methods which are suitable for the mass production. Moreover, the semiconductor elements are firmly secured to the honeycomb structural body, it is possible to manufacture easily the thermoelectric conversion module having a curved end surface which can be effectively brought into contact with a heat source.

Embodiment 3

By cutting sintered P type and N type $Si_4Ge$ semiconductor bodies, semiconductor elements of 4×4×7 mm³ were prepared. The semiconductor elements were inserted into through holes formed in a cordierite honeycomb structural body in accordance with a given pattern, Spaces between the semiconductor elements and inner walls of the through holes were filled with a so-gel glass of $SiO_2$—$TiO_2$. The so-gel glass of $SiO_2$—$TiO_2$ was prepared by adding tetraethoxysilane ($Si(OC_2H_5)$) and tetraorthotitanate ($Ti(OC_2H_5)$) with respective equivalent amounts of $H_2O$ in propyl alcohol as a solvent, and mixing them at a mixing ratio of 9:1 under stirring to adjust a viscosity of a gelatinized glass. The semiconductor elements having the sol-gel glass applied thereon were inserted into the through holes formed in the honeycomb structural body while spaces were filled with the sol-gel glass. After that, an assembly was dried and solidified by heating it from the room temperature to 200° C.

A module core thus obtained was sintered at 400° C. to promote the dehydration-condensation reaction of the gel. On the semiconductor elements exposed on the both surfaces of the module core were applied Ti foils having a thickness of 5 $\mu$m, and then Mo electrode segments were secured on the Ti foils in accordance with a given pattern. An assembly was heated at a temperature of 1000° C. under a high pressure of 200 kg/cm² to diffuse the electrode segments. By conducting an experiment similar to the embodiment 1 using the heater block and water cooled jacket, and an output electric power of 1 W could be attained under a temperature difference of 620° C.

In the thermoelectric conversion module of the present embodiment, both end surfaces of the module core can be polished without causing undesired drop of semiconductor elements out of through holes and undesired deviation of semiconductor elements within through holes. Therefore, it is possible to obtain easily the module core having a precisely determined height and parallelism. Further, when the electrode segments are secured to the semiconductor elements by the diffusion press method, all the electrode segments can be urged against the semiconductor elements uniformly, and thus undesired contact can be prevented. Moreover, a number of module cores can be treated simultaneously. Also in this embodiment, since no air space is formed between the semiconductor elements and inner walls of the through holes, the heat transfer does not occur, and thus a high temperature difference can be easily produced across the module core having a height of about 6.5 mm. In this manner, it is possible to attain the thermoelectric conversion module having a high conversion efficiency.

As explained above, in the thermoelectric conversion module according to the invention, the spaces between the semiconductor elements and the inner walls of the through holes formed in the honeycomb structural body are filled with the filler members made of the inorganic adhesive of alkali metal silicate or sol-gel glass. Therefore, the thermoelectric conversion module can be effectively prevented from being cracked or destroyed due to a difference in a thermal expansion coefficient between the semiconductor elements and the honeycomb structural body. Further, the semiconductor elements can be also prevented from being oxidized or dissipated. Therefore, the thermoelectric conversion module according to the invention can resist a high temperature and can be used for a long life time. Moreover, a reduction of a heat current passing through the semiconductor elements can be prevented, and thus a high conversion efficiency can be attained.

In the method according to the invention, the operation of inserting the semiconductor elements into the through holes of the honeycomb structural body and fixing them within the through holes can be performed at a low temperature near the room temperature without using a special jig. Therefore, the thermoelectric conversion module can be manufactured easily on a large scale at a low cost. Since the semiconductor elements are fixed within the through holes, end faces of the module core can be polished easily and precisely. Therefore, it is possible to obtain the thermoelectric conversion module having precisely determined height, flatness and parallelism. Moreover, the end surface of the module core can be polished into a curved shape which matches an outer configuration of a member on which the thermoelectric conversion module is to be provided. Therefore, in case of constructing an electric power generating system using a plurality of thermoelectric conversion modules, it is possible to attain a high power generating efficiency in a simple manner.

Further, when the semiconductor elements are made of a semiconductor material mainly consisting of silicon-germanium, the electrode segments can be uniformly secured or fixed to the semiconductor elements by means of the braze welding method or diffusion press method. In this manner, the possibility of contact failure can be reduced. Moreover, since the filler members are made of a material whose thermal deformation is small and which has an excellent faculty for mitigating a difference in a thermal expansion coefficient between the semiconductor elements and honeycomb structural body one can form a module that can compensate for the differences in the thermal expansion coefficient of the semiconductor elements and the honeycomb structural body. Therefore, the method of forming the thick electrode films can be advantageously utilized.

What is claimed is:

1. A thermoelectric conversion module comprising:
   a honeycomb structural body made of an electrically insulating material, having mutually opposing first and second end surfaces, and having formed therein a plurality of through holes extending from the first end surface to the second end surface, alternating one or more through holes being classified into a first group and the remaining through holes being classified into a second group;
   N type semiconductor elements, each being inserted into respective one of the through holes of the first group;
   P type semiconductor elements, each being inserted into respective one of the through holes of the second group;
   electrodes connecting adjacent N type and P type semiconductor elements or element groups in series on said first and second end surfaces of the honeycomb structural body; and
   electrically insulating filler members provided in spaces between the semiconductor elements and inner walls of the through holes formed in said honeycomb structural body and made of an inorganic adhesive of alkali metal silicate or sol-gel glass.

2. A thermoelectric conversion module according to claim 1, wherein each of said semiconductor elements is formed by a sintered body.

3. A thermoelectric conversion module according to claim 1, wherein said N type and P type semiconductor elements are made of a semiconductor material mainly consisting of silicon-germanium.

4. A thermoelectric conversion module according to claim 3, wherein said semiconductor material is made of $Si_xGe$, in which x=0.6–5.7.

5. A thermoelectric conversion module according to claim 4, wherein said semiconductor material comprises an additive selected from the group consisting of B, Al, Ga, In, N, P, As, Sb, Zn, C, O and H.

6. A thermoelectric conversion module according to claim 1, wherein said honeycomb structural body is made of an electrically insulating material selected from the group of cordierite, alumina, silicon carbide and silicon nitride.

7. A thermoelectric conversion module according to claim 1, wherein said inorganic adhesive of alkali metal silicate or sol-gel glass contains at least one aggregate agent selected from the group consisting of silica, zirconia, alumina and silicon carbide.

8. A thermoelectric conversion module according to claim 1, wherein said electrodes are formed by electrode segments made of a metal selected from the group consisting of Cu, Mo, Ni—Cr, W, Ta, alloys of these metals and stainless steel alloy.

9. A thermoelectric conversion module according to claim 8, wherein said electrode segments have a thickness of about 0.2 mm.

10. A thermoelectric conversion module according to claim 1, wherein said electrodes are formed by electrode films made of a metal selected from the group consisting of Cu, Mo, Ni—Cr, W, Ta, alloys of these metals.

11. A thermoelectric conversion module according to claim 10, wherein said electrode films have a thickness of about 100 $\mu$m.

12. A thermoelectric conversion module according to claim 1, wherein at least one of first and second end surfaces of the thermoelectric conversion module is curved.

13. A thermoelectric conversion module according to claim 1, wherein the module further comprises at least one electrically insulating substrate applied on at least one end surface of the module.

14. A method of manufacturing a thermoelectric conversion module comprising the steps of:

preparing a honeycomb structural body made of an electrically insulating material, having mutually opposing first and second end surfaces and having formed therein through holes extending from the first end surface to the second end surfaces, alternating one or more through holes being classified into a first group and the remaining through holes being classified into a second group;

inserting N type semiconductor elements into the through holes belonging to the first group and P type semiconductor elements into the through holes belonging to the second group;

filling spaces formed between semiconductor elements and inner walls of the through holes with an electrically insulating filling material made of an inorganic adhesive of alkali metal silicate or a sol-gel glass;

drying and solidifying the electrically insulating filling material filled in the spaces to form electrically insulating filler members to obtain a module core;

polishing at least one end surface of the module core; and connecting alternating N type semiconductor elements or element groups and P type semiconductor elements or element groups in series by means of electrodes on said first and second end surfaces of the honeycomb structural body.

15. A method according to claim 14, wherein prior to inserting said semiconductor elements into the through holes formed in the honeycomb structural body, said electrically insulating filling material is coated on the semiconductor elements, and after inserting the semiconductor elements into the through holes, the spaces between the semiconductor elements and the inner walls of the through holes are filled with the electrically insulating filling material.

16. A method according to claim 14, wherein said electrodes are formed by electrodes segments and are secured to the semiconductor elements by means of soldering or braze welding or diffusion-pressure.

17. A method according to claim 14, wherein said electrodes are formed by means of thermal spraying.

18. A method according to claim 14, wherein after forming the electrodes, an electrically insulating film is applied on at least one end surface of the module core.

19. A method according to claim 14, wherein after forming the electrodes, at least one end surface of the module core is polished into a curved shape.

* * * * *